(12) United States Patent
Moeggenborg et al.

(10) Patent No.: US 8,251,777 B2
(45) Date of Patent: Aug. 28, 2012

(54) POLISHING SLURRY FOR ALUMINUM AND ALUMINUM ALLOYS

(75) Inventors: Kevin Moeggenborg, Naperville, IL (US); John Clark, Montgomery, IL (US); Jeffrey Gilliland, Montgomery, IL (US); Stanley Lesiak, Naperville, IL (US); Susan Wilson, Yorkville, IL (US); Vlasta Brusic, Geneva, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1149 days.

(21) Appl. No.: 12/069,495

(22) Filed: Feb. 11, 2008

(65) Prior Publication Data

US 2008/0200098 A1    Aug. 21, 2008

Related U.S. Application Data

(63) Continuation-in-part of application No. 11/173,518, filed on Jun. 30, 2005, now Pat. No. 8,062,096.

(51) Int. Cl.
*B24B 13/00* (2006.01)

(52) U.S. Cl. .......... 451/41; 451/37; 451/57; 451/60; 451/79; 451/81; 451/92; 451/142; 451/297; 451/526; 451/534; 451/539

(58) Field of Classification Search .............. 451/41, 451/37, 57, 60, 79, 81, 92, 142, 297, 526, 451/534, 539
See application file for complete search history.

(56) References Cited

U.S. PATENT DOCUMENTS

| | | | |
|---|---|---|---|
| 4,839,005 A | 6/1989 | Katsumoto et al. | |
| 5,209,816 A | 5/1993 | Yu et al. | |
| 6,350,176 B1 * | 2/2002 | Lyons et al. | 451/41 |
| 6,554,878 B1 | 4/2003 | Dill, Jr. et al. | |
| 2003/0082998 A1 * | 5/2003 | Carter et al. | 451/41 |
| 2003/0176151 A1 * | 9/2003 | Tam et al. | 451/41 |
| 2003/0220061 A1 * | 11/2003 | Prasad | 451/526 |
| 2004/0261323 A1 * | 12/2004 | Minamihaba et al. | 51/309 |
| 2004/0266326 A1 * | 12/2004 | Shiho et al. | 451/526 |

* cited by examiner

*Primary Examiner* — Robert Scruggs
(74) *Attorney, Agent, or Firm* — Thomas E. Omholt; Francis J. Koszyk; Steven D. Weseman

(57) ABSTRACT

The invention is directed to a method of polishing a surface of an object that includes aluminum. The method includes the step of contacting the surface of the object with a soft polishing pad and a polishing composition. The polishing composition includes abrasive particles, an agent that oxidizes aluminum, and a liquid carrier to polish the surface of the object. The polishing composition includes the abrasive particles suspended in the liquid carrier, and is applied at a pH above about 7.

13 Claims, No Drawings

POLISHING SLURRY FOR ALUMINUM AND ALUMINUM ALLOYS

CROSS-REFERENCE TO RELATED APPLICATIONS

This application is a continuation-in-part of U.S. application Ser. No. 11/173,518, which was filed Jun. 30, 2005 now U.S. Pat. No. 8,062,096, and published Jan. 11, 2007 as US 2007/0010098 A1.

FIELD OF THE INVENTION

This invention pertains to materials and methods for polishing a surface of an aluminum-containing object to a high quality, mirror finish.

BACKGROUND OF THE INVENTION

Metallic mirrors have numerous applications. In the field of optics, for example, metallic mirrors are employed to direct and focus electromagnetic radiation. Mirror surfaces are traditionally formed by applying a metallic coating to a substrate composed of another metal or of another material such as glass. When subjected to temperature variations, such as those occurring in various space and military applications, differential rates of expansion and contraction of the joined materials typically lead to dimensional instability of the mirror surface. One solution has been to create a mirror surface composed of a single metal or metal alloy, where the mirror surface is generated by polishing a surface of the single-component object. Use of a single metal or metal alloy in a single-component mirror surface obviates problems caused by differences in thermal properties of joined materials and provides enhanced mechanical strength and rigidity. Aluminum is a suitable metal in a single-component mirror surface due to its high reflectivity, light weight, low cost, and compatibility with conventional surface forming processes. However, aluminum is a relatively soft material with a Mohs hardness of 2.75. As such, use of conventional polishing abrasives with a Mohs hardness of about 8.5 and above (e.g., alumina or silicon carbide) may result in scratches or chatter marks on the aluminum mirror surface.

The performance of such mirrors in optics applications depends strongly on the mirror surface being highly uniform to minimize light scattering caused by topographical variations and defects. To optimize performance of the mirror surface, the topographical variations and defects at the surface of the mirror must be reduced or eliminated. Surface roughness parameters relevant to optical performance include not only average surface roughness (Ra) or root mean square surface roughness (Rq), but also importantly parameters including Rmax and/or Rz. Rmax is the largest peak-to-valley height in a given sampling region wherein the peak represents a high spot on the mirror surface and the valley represents the depth of a scratch or other topographical variation on the mirror surface. Rz is an average value for Rmax measured in several distinct sampling regions. Not only must average surface roughness be low for good optical performance, but also Rz, Rmax or related parameters must be low to minimize light scattering.

Highly-polished aluminum mirror surfaces have additional applications in the field of solar cell fabrication. Mirror arrays are frequently used to concentrate solar radiation onto photovoltaic solar cells to improve conversion efficiency. Because diffraction of light by surface irregularities on the mirror surfaces results in lowered efficiencies in conversion of incident solar radiation to electric power, improved methods for economically producing highly-reflective mirror surfaces composed of aluminum can facilitate development of solar cell technology.

Two methods commonly used to polish aluminum surfaces are single-point diamond turning and lapping. In the field of optics, single-point diamond turning has been used for many years to produce aluminum mirrors useful for reflecting infrared (e.g., long wavelength) light. In single-point diamond turning, an aluminum substrate is rotated while in contact with a precisely positioned diamond cutting tool. The diamond cutting tool "peels" a very thin layer of aluminum from the surface of the substrate to form a surface having a precisely defined geometry. The diamond turning technique typically can achieve surface roughness (Rq) around 50 Å. However, for optical applications, a lower surface roughness (Rq) is required, such as about 20 Å. In addition, the diamond cutting tool produces microscopic grooves on the surface of the substrate that compromise optical performance due to light scattering, particularly at shorter wavelengths. Further, single-point diamond turning is an expensive and highly time-consuming process suitable only for low volume production of specialized optical components.

The most commonly used process for polishing aluminum surfaces is lapping. In lapping, a slurry of abrasive particles is used to polish an aluminum surface by moving a polishing surface relative to the aluminum surface with the abrasive slurry therebetween. The abrasive slurry is commonly a suspension of aluminum oxide or silicon carbide particles in a carrier of water or oil. The aluminum surface is abraded by mechanical action of the particles in the abrasive slurry. However, lapping generates shavings of aluminum from the aluminum surface that tend to produce microscratches that are unacceptable for optical applications. In addition, abrasive slurries that contain a plurality of abrasive particles suspended in liquid carrier are often colloidally unstable. In particular, the abrasive particles tend to settle out of the liquid carrier, agglomerate, or aggregate, any of which may result in irregularities on the mirror surface.

Chemical-mechanical polishing or planarization (CMP) has long been used in the electronics industry to polish or planarize the surface of memory or rigid disks. Typically, memory or rigid disks comprise an aluminum substrate coated with a first layer of nickel-phosphorus. The nickel-phosphorus layer is frequently planarized by a CMP process to reduce surface roughness prior to coating with a magnetic layer, such as cobalt-phosphorus. However, CMP may produce microscratches and leave imbedded abrasive particles on the polished surface. These defects may be acceptable for the noted electronics applications, but cannot be tolerated in optical applications.

Thus, there remains a need for efficient and economical methods of polishing aluminum surfaces to exacting standards of surface roughness suitable for at least substantially diffraction-free reflectance of light in the visible and ultraviolet ranges. The invention provides such a method. These and other advantages of the invention, as well as additional inventive features, will be apparent from the description of the invention provided herein.

BRIEF SUMMARY OF THE INVENTION

The invention provides a method of polishing a surface of an object comprising aluminum, which method comprises the steps of (i) providing the object, (ii) providing a soft polishing pad having a Shore A hardness value of 20-80, and (iii) providing a polishing composition having a pH above about 7. The polishing composition includes (a) an abrasive (b) an agent that oxidizes aluminum and (c) a liquid carrier. Preferably, the abrasive is selected from the group consisting of silica, ceria, and zirconia; which abrasive includes particles thereof that are suspended in the liquid carrier. The method further includes the steps of (iv) contacting a surface of the object with the polishing pad and the polishing composition, and (v) polishing the surface of the object to achieve a mirror surface, wherein the mirror surface has 30 angstroms or less rms surface roughness.

In another embodiment, the present invention provides an aluminum-containing surface, such as a mirror, that is polished by the polishing method set forth herein. The aluminum containing surface, polished by the inventive method, contains a surface roughness of 30 angstroms or less.

DETAILED DESCRIPTION OF THE INVENTION

The invention provides a method of polishing a surface of an object comprising aluminum. The method comprises the steps of (i) providing an object, (ii) providing a soft polishing pad having a Shore A hardness value of 20-80, (iii) providing a polishing composition, (iv) contacting a surface of the object with the polishing pad and the polishing composition, and (v) polishing the surface of the object. The polishing step may involve a loss of at least a portion of the outermost surface of the object, i.e., the surface of the object may be abraded. The polishing composition comprises (a) an abrasive (b) an agent that oxidizes aluminum, and (c) a liquid carrier. The polishing composition has a pH above about 7.

The surface of the object comprises aluminum. In particular, the surface of the object can comprise pure aluminum or an aluminum alloy. Numerous aluminum alloys are commercially available that are individually characterized by the presence of various elements in addition to aluminum and by the particular processes used in their production. Aluminum alloys are further subdivided into foundry alloys and wrought alloys, wherein foundry alloys are intended for use in molding processes employing the molten alloys, and wrought alloys are intended for use in mechanical shaping processes of the solid alloys. Wrought alloys are often further heat-treated to modify mechanical properties (e.g., hardness) of the alloys. Any aluminum alloy is suitable for use in the inventive method, although some aluminum alloys may contain large numbers of inclusions and other defects that negatively impact surface finish after polishing. In one embodiment, the object comprises an aluminum alloy of the 6000 series or 7000 series, wherein the term "6000 series" refers to the Aluminum Association designation of a particular group of aluminum alloys. In particular, the aluminum alloy can be a 6061 aluminum alloy, which in addition to aluminum comprises silicon, iron, copper, manganese, magnesium, chromium, zinc and titanium.

A polishing pad serves as a polishing surface to polish the surface of the object comprising aluminum. Many polishing pads are known in the art. The polishing pad of the present invention can be a conventional one-piece polishing pad, wherein a surface of the polishing pad makes contact with the surface of the object being polished. Suitable polishing pads include, soft, felt-type pad with a Shore A hardness value of 20-80. Examples of suitable pads include, without limitation, POLITEX™ Prima polishing pads (Rohm and Haas, Philadelphia, Pa.).

Furthermore, the polishing pad can have any suitable dimensions. In one embodiment, the polishing pad is a disc shape (as is used in rotary polishing tools). In other embodiments, the polishing pad is produced as a looped linear belt (as is used in linear polishing tools) or has a rectangular shape (as is used in oscillating polishing tools).

The polishing composition is a chemical-mechanical polishing (CMP) composition that comprises an abrasive, an agent that oxidizes aluminum, and a liquid carrier. The polishing composition preferably has a pH of 7 or greater. More preferably, the polishing composition has a pH of 8 or greater; yet more preferably, the polishing composition pH is 9 or greater. A preferred range of pH for the polishing composition is between about 8 and about 12; a more preferred range is between about 8 and about 10. The preferred pH for the polishing composition is about 9 or about 10; the more preferred pH is about 9.

The abrasive preferably is in the form of or includes particles that can be suspended in the liquid carrier, thereby forming a colloid. Preferred abrasives are selected from the group consisting of silica, ceria, and zirconia. More preferred abrasives comprise silica. Preferred silica abrasives used in the context of the present invention include fumed silica, precipitated silica, and condensation-polymerized silica. Yet more preferred abrasives are fumed silica.

The abrasive particles desirably have an average particle size (Dv(50%)) of at least about 10 nm or more (e.g., about 25 nm or more, or about 100 nm or more). Preferably, the abrasive particles have an average particle size of about 1000 nm or less (e.g., about 800 nm or less, or about 500 nm or less, or even about 300 nm or less). Of course, any of the above amounts expressed in terms of optional upper and lower limits also can be expressed as ranges (e.g., about 10 nm to about 1000 nm, or about 25 nm to about 800 nm, or about 100 nm to about 500 nm).

The abrasive particles can be present in the polishing composition in any suitable amount. In one embodiment, the amount of abrasive particles present in the polishing composition is preferably about 1 wt % or more, based on the total weight of the polishing composition. In addition, the amount of abrasive particles present in the polishing composition is preferably about 20 wt % or less (e.g., about 15 wt % or less, about 10 wt % or less, or about 9 wt % or less). More preferably, the amount of abrasive present in the polishing composition is about 1 wt % to about 20 wt % (e.g., about 3 wt % to about 10 wt %.

The abrasive particles are suspended in the polishing composition, more specifically in the liquid carrier of the polishing composition. When the abrasive particles are suspended in the polishing composition, the polishing composition is preferably colloidally stable. Colloidal stability refers to the maintenance of the suspension of abrasive particles in the liquid carrier over time. In the context of this invention, the polishing composition is considered colloidally stable if, when the abrasive particles are placed into a 100 mL graduated cylinder and allowed to stand for two hours, the difference between the concentration of abrasive particles in the bottom 50 mL of the graduated cylinder (represented by [B] in terms of g/mL) and the concentration of abrasive particles in the top 50 mL of the graduated cylinder (represented by [T] in terms of g/ml) divided by the initial concentration of abrasive particles in the polishing composition (represented by [C] in terms of g/ml) is less than or equal to 0.5 (i.e., $\{[B]-[T]\}/[C] \leq 0.5$). The value of [B]−[T]/[C] for the polishing composition desirably is less than or equal to 0.3, and preferably is less than or equal to 0.1.

The liquid carrier can be aqueous or nonaqueous. Preferably, the liquid carrier is aqueous. Suitable liquid carriers include water, and solutions of alkylene glycols in water. Preferred alkylene glycols used in the context of the present invention include ethylene glycol (EG), polyethylene glycol (PEG), and polypropylene glycol (PPG). Most preferably, the liquid carrier is water.

The agent that oxidizes aluminum is also included in the polishing composition. The agent that oxidizes aluminum can be any suitable agent that oxidizes aluminum. In one embodiment, the agent that oxidizes aluminum is selected from the group consisting of persulfates, hydrogen peroxide ($H_2O_2$), potassium hydrogen peroxymonosulfate, peracetic acid, and potassium peracetate. Preferably, the oxidizing agent employed is ammonium persulfate (APS), $H_2O_2$, potassium hydrogen peroxymonosulfate sulfate, peracetic acid, or a mixture thereof. More preferably, the oxidizing agent is APS.

The polishing composition can comprise any suitable amount of the agent that oxidizes aluminum. In one embodiment, the polishing composition comprises from about 0.05 wt. % to about 5 wt. %, and more preferably from about 0.1 wt. % to about 2 wt. % (e.g. 1 wt. %) of the agent that oxidizes aluminum, based on the total weight of the polishing composition.

The polishing composition optionally comprises any suitable amount of an organic acid. Organic acids useful in the polishing composition include monocarboxylic and dicarboxylic acids and their salts. Preferably, the organic acid is selected from the group consisting of acetic acid, propionic acid, butyric acid, benzoic acid, formic acid, malonic acid, succinic acid, oxalic acid, lactic acid, tartaric acid, amino acid, derivatives thereof, salts thereof, and combinations thereof. More preferably, the organic acid is succinic acid.

It will be appreciated that the aforementioned organic acids can exist in the form of a salt (e.g., a metal salt, an ammonium salt, or the like), an acid, or as a partial salt thereof. For example, succinates include succinic acid, as well as mono- and di-salts thereof. Furthermore, organic acids including basic functional groups can exist in the form of an acid salt of the basic functional group. For example, glycines include glycine, as well as monoacid salts thereof.

The polishing composition preferably has a pH of greater than about 7. Abrasive particles consisting of silica typically do not remain well-dispersed throughout the liquid carrier of the polishing composition in an acidic regime. As such, use of a low pH polishing composition that includes silica abrasive particles may result in a hazy finish on an aluminum mirror surface or a higher surface roughness than otherwise would be achievable had an alkaline or neutral polishing composition been used during polishing. In addition, in the case of aluminum in the alkaline pH regime, the surface metal oxide layer inherent in the metal surface or more specifically, the surface alumina layer on the surface of the aluminum-containing object, is more soluble than in the acidic regime. That is, the layer of alumina inherently present on the surface of the aluminum-containing object is destroyed more easily at higher pH values, which allows the underlying aluminum surface to corrode or undergo polishing more easily and efficiently.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be an acid or a base, as appropriate, including without limitation, nitric acid, potassium hydroxide, sodium hydroxide, ammonium hydroxide, or a combination thereof. The pH buffering agent can be any suitable buffering agent, for example, phosphates, acetates, borates, ammonium salts, and the like. The polishing composition can comprise any suitable amount of a pH adjustor and/or a pH buffering agent, provided such amount is sufficient to achieve and/or maintain the pH of the polishing system within the ranges set forth herein.

The polishing composition optionally further comprises one or more other additives. Such additives include any suitable surfactant. Suitable surfactants include, for example, anionic surfactants, anionic polyelectrolytes, nonionic surfactants, amphoteric surfactants, fluorinated surfactants, mixtures thereof, and the like.

The polishing composition optionally further comprises an anti-foaming agent. The anti-foaming agent can be any suitable anti-foaming agent. Suitable anti-foaming agents include, but are not limited to, silicon-based and acetylenic diol-based anti-foaming agents, respectively. The amount of anti-foaming agent present in the polishing composition typically is from about 40 ppm to about 140 ppm.

The polishing composition optionally further comprises a biocide. The biocide can be any suitable biocide, for example, an isothiazolinone biocide. The amount of biocide used in the polishing composition typically is from about 1 ppm to about 500 ppm, and preferably from about 10 ppm to about 200 ppm.

The polishing composition can be prepared in any suitable manner. Generally, the polishing composition can be prepared by combining and mixing the components thereof in a batch or continuous process. Furthermore, the polishing composition can be prepared in-whole or in-part prior to use, or each of the individual components of the polishing composition can be separately stored and combined immediately prior to or during use. When the polishing composition is prepared in-part prior to use, one or more components of the polishing composition, such as an agent that oxidizes aluminum, can be added to the polishing composition just before or during use (e.g., within about one minute before use, or within about one hour before use, or within about seven days before use). When all or some of the components of the polishing composition are separately stored and combined during use, the components can be delivered to the surface of the object being polished, where the components are combined and mixed to provide the polishing composition. The pH of the polishing composition or any one or more of its components can be adjusted at any suitable time.

The surface of the object comprising aluminum can have any shape or curvature. The surface of the object comprising aluminum can have substantially no curvature (e.g., the surface of the object can be substantially planar), or the surface can have a curvature (e.g., the surface of the object can be convex or concave). Surface curvature can be produced by a number of methods, all of which are well known in the art. Alternatively, the object can have multiple non-coplanar surfaces, by which electromagnetic radiation can be directed at various predetermined locations.

The surface of the object comprising aluminum can be as-formed by any suitable process used to produce the object. The surface of the object comprising aluminum can be formed by a mechanical working process (e.g., rolling, extrusion, and forging) or the surface of the object can be produced by a casting process (e.g., sand casting, permanent mold casting, and die casting). The surface of the object comprising aluminum can be milled to any specifications using methods well known in the art.

Alternatively, the surface of the object comprising aluminum can be pre-polished prior to contacting the surface of the object with the polishing pad and the polishing composition in accordance with the invention. The surface of the object comprising aluminum can be pre-polished, for example, by diamond turning. In diamond turning, an object is rotated while being contacted with a diamond cutting tool under precisely controlled conditions to remove material from the surface of the object. In so doing, microscopic slivers are cut from the surface of the object, thereby resulting in the production of a highly regular surface.

In another embodiment, the surface of the object comprising aluminum can be pre-polished by lapping. In lapping, a surface of an object is abraded by moving the surface of the object relative to a lapping surface with abrasive particles (e.g., alumina or silicon carbide) present between the surface of the object and the lapping surface. The abrasive particles are typically suspended in a liquid carrier such as water or oil. Lapping can be performed with a circular, linear, or oscillating motion. Generally, the lapping surface comprises a hard material such as cast iron or brass. In the context of the invention, lapping generally refers to any suitable technique resulting in dimensional changes principally limited to the removal of high spots on the surface of the object, including but not limited to superfinishing, buffing, honing, and the like.

The inventive method can be used to polish a surface of an object comprising aluminum to provide a polished surface having a predetermined surface roughness. Numerous measures of surface roughness are known in the art. For example, the surface roughness can be measured mechanically by moving a stylus along a surface or by using light scattering techniques. The American Society of Mechanical Engineers (ASME) standard B46.1-2002 contains descriptions of methods used to measure and express surface roughness. Thus, depending on the particular surface roughness desired for an object, the inventive polishing method can be conducted for a duration sufficient to produce the desired surface roughness. In one embodiment, the polishing operation can be interrupted, and the surface roughness determined. If the predetermined surface roughness has not been achieved, polishing can be continued until characterization of the surface of the object indicates that the desired surface roughness has been achieved.

The inventive method is particularly well-suited for the production of a mirror surface on an object comprising aluminum. In this regard, the inventive polishing method is capable of polishing an aluminum surface having an initial root mean square surface roughness (Rq) of greater than 200 nm (e.g. 500 nm) to provide an aluminum surface having a Rq of less than about 3 nm in less than one hour of polishing time. By way of contrast, single-point diamond turning of an aluminum surface requires many hours to produce a surface having a comparable value of Rq.

The following examples further illustrate the invention but, of course, should not be construed as in any way limiting its scope.

EXAMPLE 1

This example demonstrates a comparative polishing method starting with a commercially-available aluminum object having a lapped surface.

An 8 inch (20.3 cm) wafer aluminum blank, cut from a rolled metal sheet consisting of 6061 T6 aluminum alloy, having a surface lapped to a matte finish, was subjected to a two-step polishing process. The first polishing step of the two-step polishing process included polishing the wafer with a polishing composition comprising 6 wt % fumed silica and 1 wt % ammonium persulfate (APS) in water. The pH of the polishing composition was 9. The wafer was polished for 60 minutes with a downforce pressure of 27.6 kPa (4 psi) and then for 15 minutes with a downforce pressure of 20.7 kPa (3 psi), wherein the downforce pressure refers to the pressure of the object against a polishing pad. The polishing operation was accomplished using a commercially available chemical-mechanical polishing apparatus (IPEC 472, Entrepix, Inc., Tempe, Ariz.) equipped with a hard polyurethane polishing pad (D100, Cabot Microelectronics Corporation, Aurora, Ill.).

After polishing, the wafer underwent a second polishing step wherein the wafer was buffed for one minute with a second polishing composition comprising 5 wt % fumed silica and 0.03 wt % of Delonic LF-60MOD surfactant (DeForest Enterprises, Boca Raton, Fla.) in water using a Politex® Prima polishing pad (Rohm and Haas, Philadelphia, Pa.) at a downforce pressure of 13.8 kPa (2 psi). The polishing parameters were 50 rpm platen speed and 50 rpm carrier speed for all steps.

Following polishing, the total amount of surface material removed was determined to have been 168 Å or 178 Å depending on the surface region measured. The wafer was also characterized using atomic force microscopy (AFM) at 3 different surface regions to determine average surface roughness, which was Ra=1.58 nm (standard deviation=0.23 for three trials).

Additionally, the polished surface was visually inspected for scratch damage. Following the first polishing step the mirror surface was highly scratched, being very easy to detect visually. Following the second polishing step the scratching was somewhat reduced, but still very visible.

The results of this example demonstrate that the comparative method produces an aluminum-containing surface having an average surface roughness superior to that achievable by single-point diamond turning or lapping, yet with an unacceptably high scratch damage.

EXAMPLE 2

This example sets forth the polishing of an object comprising aluminum using the inventive polishing method.

A 2 inch (5.08 cm) aluminum blank, cut from an extruded aluminum bar consisting of 6061 T6 aluminum alloy having a surface lapped to a matte finish, was subjected to the inventive polishing process. The wafer was polished with a polishing composition comprising 6 wt % fumed silica and 1 wt % ammonium persulfate (APS) in water, at pH 9. The polishing tool was a Hyprez Model 15LM lapping system (Engis Corporation) with a soft, felt-type Politex® Prima polishing pad (Rohm and Haas, Philadelphia, Pa.). The downforce pressure was 3.96 kPa (0.57 psi), the platen speed was 80 rpm.

After 60 minutes of polishing the part was removed from the polisher, cleaned with DI water, dried with clean dry air.

The removal rate was measured by subtracting the final weight of the mirror from the pre-polished weight, and the amount of material removed, reported as nm/minute, was calculated by taking into account the part dimensions and density of aluminum. Removal rate for this run was 74 nm/min.

The polished wafers were evaluated for surface roughness using a white light interferometer (Wyko NT3300, Veeco Instruments, Inc.). Measurements were taken at 7 points on the mirror surface and the results averaged. RMS surface roughness (Rq) for this mirror was 1.12 nm (11.2 angstroms).

The polished mirrors were visually inspected for scratch damage. The resulting surfaces had no visible scratch damage. The use of a soft pad and a lower down force, with the inventive polishing slurry, resulted in a significantly improved surface, even when compared to the surfaces following a second polishing step as in Example 1.

EXAMPLE 3

This example illustrates the interrelationships of oxidizing agent concentrations, pH, and abrasive content of the polishing compositions on the resultant aluminum removal rate, haze clean time, and final surface roughness of the polished object comprising aluminum.

The polishing composition describe in Example 2 was varied with respect to oxidizing agent concentration (APS 0.5-1 wt %), pH (8-10) and abrasives content (3-9 wt %). The surfaces of the aluminum-containing objects each were polished for 1 hour in 15 minute increments. The same polishing tool and polishing parameters were used as described in Example 2.

At each time interval, a series of determinations of clear time with regard to lapping haze, removal rates of aluminum abraded from a surface of an object, and final surface roughness were done on the surfaces of objects comprising aluminum The results are set forth in the following table:

| Polishing Composition | | | Determinations | | | |
| --- | --- | --- | --- | --- | --- | --- |
| Abrasive (%) | APS (%) | pH | Removal Rate (nm/min) | $R_q$ (Å) | 15 min. Haze (%) | Haze Clear (min) |
| 3 | 1.5 | 8 | 9.8 | 514.2 | 100 | >60 |
| 9 | 0.5 | 8 | 29.3 | 23.6 | 100 | 60 |
| 9 | 1.5 | 8 | 28.1 | 182.5 | 100 | >60 |
| 3 | 0.5 | 8 | 9.9 | 140.3 | 100 | >60 |
| 6 | 1 | 9 | 57.9 | 11.1 | 50 | 30 |
| 6 | 1 | 9 | 57.3 | 9.0 | | |
| 6 | 1 | 9 | 49.9 | 6.5 | 100 | 30 |
| 6 | 1 (KOAc) | 9 | 30.5 | 30.5 | 100 | >60 |
| 9 | 1.5 | 10 | 52.1 | 15.1 | 100 | 45 |
| 3 | 0.5 | 10 | 29.0 | 178.8 | 100 | >60 |
| 3 | 1.5 | 10 | 32.3 | 11.5 | 100 | 45 |
| 9 | 0.5 | 10 | 35.1 | 8.1 | 100 | 45 |

The results of this example demonstrate that surface finish and time to clear haze are strongly influenced by pH of the polishing composition. At pH 8, none of the polishing compositions cleared haze in less than 60 minutes. Conversely, at pH 9 and 10, most of the polishing compositions studied cleared haze in under 60 minutes.

Of the polishing compositions having a pH of 9 and 6 wt % abrasive, only the composition having APS, and not KOAc, as the oxidant had a haze clearing of under 60 minutes. These results indicate that polishing compositions comprising the oxidizing agent ammonium persulfate (APS) provide shorter haze clear time, quicker removal rates and smoother surface finishes when compared to polishing compositions comprising potassium acetate (KOAc). Given that the ionic strength contributed by each of these compounds is equivalent, the difference in oxidizing strength of the two is the more likely contributor to the ability of the polishing compositions of the present invention to perform. Accordingly, other oxidizing agents identified above, for example potassium persulfate, are included herein as alternative or additional members of the inventive polishing composition usefully employed in the inventive polishing method for aluminum surfaces.

As the results demonstrate, it is important to keep the polishing composition at a neutral to basic pH because at a pH below neutrality, the polishing compositions of the present invention do not clear haze in less than 60 minutes nor result in Rq values of 25 Å and less in an hour of polishing.

No scratching was observed for any of the haze-free mirrors polished in this experiment. Scratching could not be determined on the hazed samples.

All references, including publications, patent applications and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a surface of an object comprising aluminum, which method comprises the steps of:
    (i) providing the object;
    (ii) providing a polishing pad having a having a Shore A hardness value of 20-80;
    (iii) providing a polishing composition having a pH greater than about 7, comprising;
        (a) an abrasive,
        (b) an agent that oxidizes aluminum, and
        (c) a liquid carrier;
    (iv) contacting a surface of the object with the polishing pad and the polishing composition, and
    (v) polishing the surface of the object to achieve a mirror surface, wherein the mirror surface has 30 angstroms or less rms surface roughness.

2. The method of claim 1, wherein the abrasive is selected from the group consisting of silica, ceria, and zirconia.

3. The method of claim 1, wherein the agent that oxidizes aluminum is selected from the group consisting of a persulfate, a peroxide, potassium hydrogen peroxymonosulfate, peracetic acid, and potassium peracetate.

4. The method of claim 3, wherein the agent that oxidizes aluminum is a persulfate.

5. The method of claim 2, wherein the abrasive is silica.

6. The method of claim 1, wherein the abrasive is present in the polishing composition in the amount of about 1 wt % to about 20 wt % based on the total weight of the polishing composition.

7. The method of claim 1, wherein the abrasive is present in the polishing composition in an amount about 3 wt. % to about 10 wt. % based on the total weight of the polishing composition.

8. The method of claim 4, wherein the persulfate is ammonium persulfate.

9. The method of claim 1, further comprising the step of pre-polishing the surface of the object prior to contacting the surface of the object with the polishing pad and the polishing composition.

10. The method of claim 1, wherein the object comprising aluminum is an aluminum alloy.

11. The method of claim 1 wherein the pH of the polishing composition is between about 8 to about 10.

12. The method of claim 1, wherein the agent that oxidizes aluminum is present in a concentration about 0.05 wt. % to about 5 wt. %, based on the weight of the polishing composition.

13. The method of claim 1, wherein the agent that oxidizes aluminum is present in a concentration about 0.1 wt. % to about 2 wt. %, based on the weight of the polishing composition.

* * * * *